United States Patent [19]

Gottlieb

[11] 4,436,953
[45] Mar. 13, 1984

[54] BUS BAR ASSEMBLY WITH DISCRETE CAPACITOR ELEMENTS

[75] Inventor: Michael M. Gottlieb, Kraainem, Belgium

[73] Assignee: Rogers Corporation, Rogers, Conn.

[21] Appl. No.: 249,392

[22] Filed: Mar. 31, 1981

[51] Int. Cl.³ .............................................. H01B 7/00
[52] U.S. Cl. ................................................. 174/72 B
[58] Field of Search ...................................... 174/72 B

[56] References Cited

U.S. PATENT DOCUMENTS 3,778,735  12/1973  Steenmetser .................. 174/72 B X
4,236,046  11/1980  DeVries ............................ 174/72 B
4,266,091   5/1981  Fukuda ............................. 174/72 B Primary Examiner—Laramie E. Askin
Attorney, Agent, or Firm—David S. Fishman

[57] ABSTRACT

Constructions of miniature bus bar assemblies which incorporate discrete capacitive elements having a high dielectric constant are presented herein. The capacitive elements are preferably metallized ceramic wafers which are bonded between a pair of bus bar conductors. In one embodiment bonding by strips of solder. In other embodiments, printed circuit elements are employed, both for electrical connection between the capacitor elements and the bus bars and to define the bus bars.

9 Claims, 6 Drawing Figures

BUS BAR ASSEMBLY WITH DISCRETE CAPACITOR ELEMENTS

BACKGROUND OF THE INVENTION

1. Field of the Invention

This invention relates to bus bars and especially to relatively small or miniature bus bars. More particularly, this invention relates to multilayer bus bar assemblies wherein the bus bar assemblies incorporate capacitive elements between adjacent bus conductor strips to provide bus bars characterized by high capacitance.

2. Description of the Prior Art

Conventional bus bars of relatively small or miniature size have been known in the art for a number of years. The devices are used for power and/or signal distribution in many systems, such as, for example, computer back panels and integrated circuit systems. Such prior art multilayer bus bars comprise at least two conductive plates (usually in the form of elongated strips or bars of copper) separated by an insulating film. A typical prior art bus bar of this type may use copper conductors having a thickness of about 10 mils, and the overall dimensions of the bus bar may be from about 0.019 to 0.120 inch thick, from about 0.150 to 0.200 inch wide and range in length up to about 16 inches. Typically, the separating insulating layer is a plastic dielectric film such as the polyester material know as MYLAR. The MYLAR separator layer and the conductive plates are bonded together by an adhesive. Conventional prior art bus bars of this type have relatively low capacitance which results in the devices being comparatively ineffective in attenuating high frequency noise. This high frequency noise is highly undesirable, especially when the bus bar is used for signal distribution.

One prior art approach to eliminating this noise problem involves connecting capacitors to the bus bar after the completion of the bus bar assembly. While this approach raised the capacitance and minimized the noise, it resulted in additional expense and time in manufacturing.

Another type bus bar structure known in the prior art includes discrete capacitive elements disposed between a pair of conductors. The bus bars have the desired high capacitance. Examples of such high capacitance bus bars are disclosed in U.S. Pats. Nos. 4,236,038 and 4,236,046 and in patent application Ser. No. 950,266, filed Oct. 10, 1978, now U.S. Pat. No. 4,226,091, all of which are owned by the assignee of the present invention. The high capacitive elements utilized in this type of bus bar assembly are thin layers or chips of dielectric material, usually a ceramic with a high dielectric constant. The opposing surfaces of the chips are coated with a thin, integral and continuous film of conductive material and these conductive films are electrically connected to respective ones of the bus conductors.

SUMMARY OF THE INVENTION

The present invention provides novel constructions of miniaturized bus bars incorporating discrete capacitive elements. These capacitive elements are ceramic chips or wafers with metalized surfaces; and the present invention presents means for securing and connecting the capacitive elements between a pair of bus bars in a miniature bus bar assembly.

In accordance with one embodiment of the present invention, the capacitive elements and the bus bar conductors are electrically and mechanically interconnected by solder ribbons positioned between the conductive surfaces formed on the ceramic chips and the bus bar conductors.

In another embodiment of the present invention a printed circuit element, such as a Mylar plastic film with conductive patterns thereon, serves as an electrical interconnecting path between the conductive surfaces of the ceramic chips and the bus bar conductors.

In still another embodiment of the present invention printed circuitry defines both the bus bar conductors and the interconnection path between the metallized surfaces of the ceramic chips and the bus bar conductors.

BRIEF DESCRIPTION OF THE DRAWINGS

Referring to the several FIGURES of the drawings, wherein like elements are numbered alike in the several FIGURES.

DESCRIPTION OF THE PREFERRED EMBODIMENTS

Figure 1:
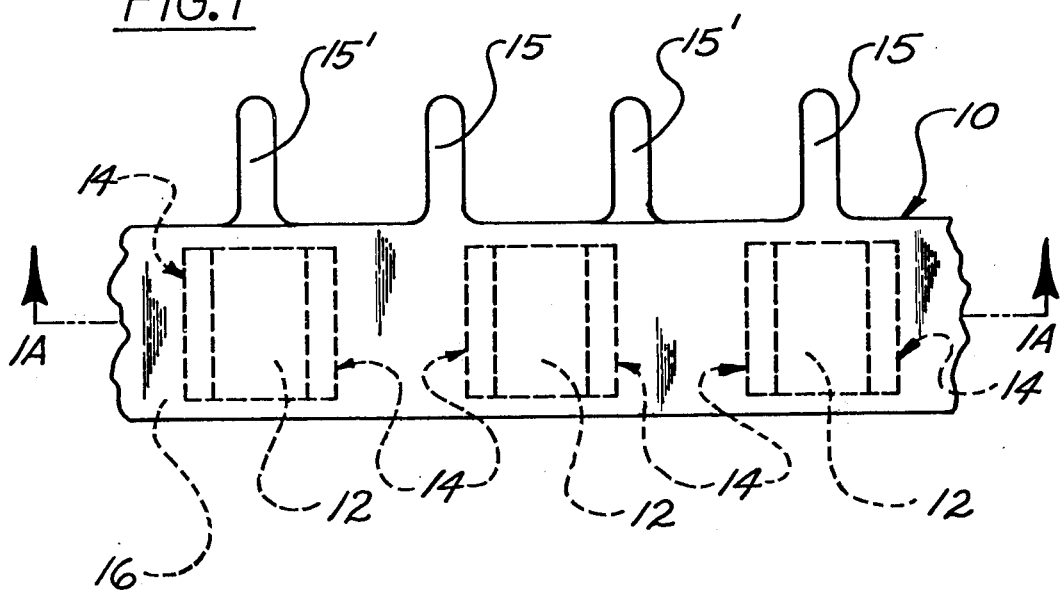
FIG. 1 is a top plan view of a section of a bus bar assembly in accordance with one embodiment of the present invention.
Figure 1A:
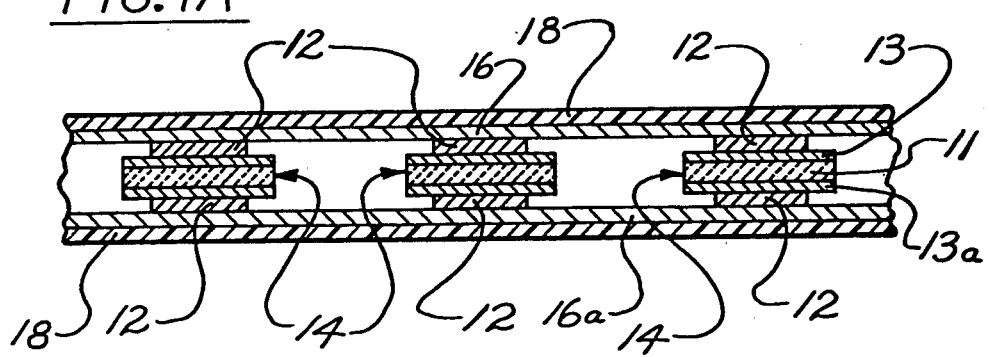
FIG. 1A is a cross-sectional side elevation view taken along line 1A—1A of FIG. 1.

Referring to FIGS. 1 and 1A, a bus bar assembly is indicated generally at 10. The bus bar assembly 10 has a plurality of capacitive elements 14 sandwiched between a pair of spaced apart bus bar conductors 16 and 16a. Each of the chips 14 is comprised of a layer or wafer 11 of ceramic material, such as barium titanate, coated on respective of a pair of the opposed surfaces with layers 13 and 13a of silver or other conductive material. The layers of silver or other conductive material 13, 13a with the layer of dielectric material 11 sandwiched therebetween define capacitive elements which are indicated generally at 14. Each of the bus bar conductors 16 and 16a has respective distribution prongs or fingers 15 and 15' projecting therefrom to serve as distribution elements for power or signals carried by the bus bar.

In the embodiment of FIGS. 1 and 1A the conductive layers 13, 13a of each capacitive element are connected mechanically and electrically to their adjacent bus bar conductors by solder strips 12. The solder strips are placed in position in the assembly as shown in FIG. 1A, and the assembly is then subjected to heat and mild pressure, if necessary, to effect direct mechanical and electrical connection, through the solder strips 12 between the bus bar conductors 16, 16a and the capacitive elements 14. The chips are thus approriately connected to serve as filters to eliminate or reduce unwanted noise.

The outer surfaces of bus bar conductors 16, 16a will typically be coated with a layer 18 of insulating plastic material, or the entire assembly may be encapsulated in such insulating plastic material.

Figure 2:
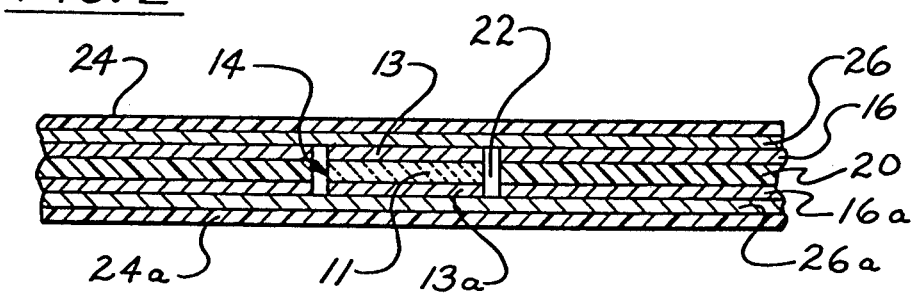
FIG. 2 is a partial cross-sectional side elevation view of a segment of a bus bar assembly in accordance with a second embodiment of the present invention.

Referring to FIG. 2, a second embodiment of the present invention is shown. It will be understood that the configuration shown in FIG. 2 is an enlarged view showing only one capacitive element 14 interconnected between the bus bar conductors 16, 16a but the entire assembly will include a series of capacitive chips similarly connected in the bus bar assembly.

In the FIG. 2 arrangement the bus bar conductors 16, 16a are laminated to and are spaced apart by an insulator 20 which may be a strip of plastic such as a polyester material known as Mylar for example. The bus bar conductors 16, 16a and spacer 20 are bonded together to form a laminate. Openings 22, which may be viewed as windows or pockets, are formed in the laminated array of bus bar conductors 16, 16a and spacer 20, and a capacitive element 14 is located in each opening 22. Printed circuit assemblies, each of which consists of a plastic sheet 24 (e.g., polyester material known as Mylar) with a conductive line or other pattern 26 etched or deposited on the inwardly facing side thereof, bridges the opening 22. Preferably, the printed circuit substrates 24 and 24a and their respective conductors 26 and 26a extend the entire length of the bus bar assembly. The printed circuit conductor elements 26 and 26a are directly connected to respective bus bar conductors 16 and 16a at each side of each opening 22 as well as being connected to respective conductive layers 13 and 13a on the capacitive elements 14. Thus, the printed circuit conductors 26, 26a serve as an electrical connector to connect conductive surfaces 13, 13a of capacitive elements 14 to the bus bars 16, 16a. Thus, it can be seen that each bus bar is connected to one conductive plate of the capacitive element 14, so the capacitive chips are effectively connected into the circuit to provide filtering. The interconnection of the printed circuit conductors 26 and 26a to the bus bars and to the conductive surfaces of capacitive elements 14 may be accomplished by use of conductive adhesive or by any other standard technique to accomplish electrical interconnection and mechanical interconnection as well, if desired. Preferably, the printed circuit assemblies of plastic substrates 24, 24a and conductors 26, 26a extend along the entire length of the bus bar assembly, so that the printed circuit substrate on each side of the assembly can also serve as an outer insulating layer for the bus bar assembly, similar to layer 18 of FIGS. 1 and 2, or the entire assembly may be encapsulated in insulating plastic.

Figure 3:
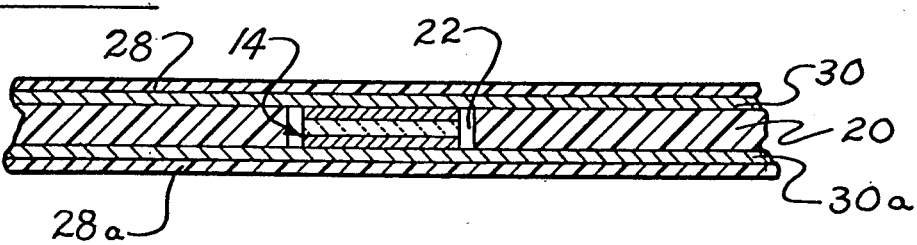
FIG. 3 is a partial cross-sectional side elevation view along line 3—3 of FIG. 4 of a segment of a bus bar assembly in accordance with another embodiment of the present invention.
Figure 4:
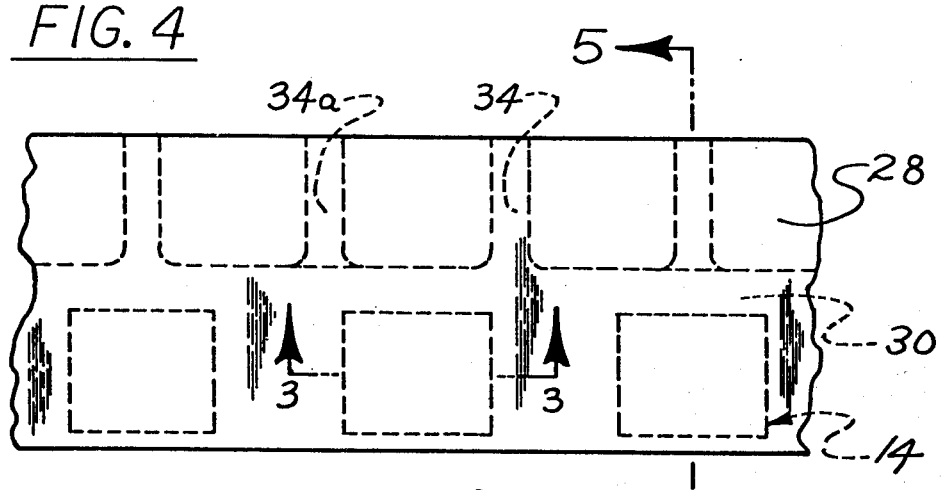
FIG. 4 is a top plan view of a segment of the bus bar assembly of FIG. 3.
Figure 5:
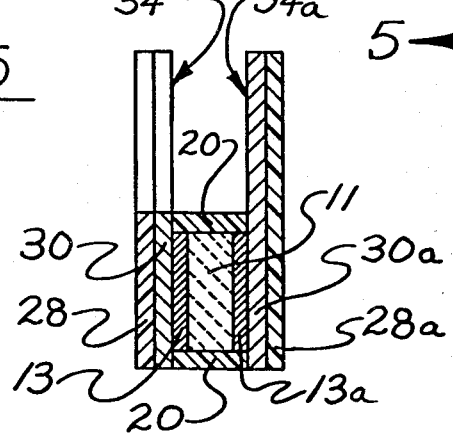
FIG. 5 is a view along line 5—5 of FIG. 4.

Referring now to FIGS. 3, 4 and 5, another embodiment of the present invention is shown wherein the bus bar assembly is made up of printed circuit elements. In this embodiment, the capacitive elements 14 are positioned in openings or pockets 22 in a central insulating and separating layer 20. A printed circuit assembly comprised of a plastic sheet 28 with a conductive pattern 30 formed thereon (by etching or deposition technique) is positioned on one side of spacer 20, and a similar printed circuit array of plastic sheet 28a and conductive pattern 30a is positioned on the other side of separator 20. As can best be seen in FIGS. 4 and 5, the conductive pattern 30 (as well as the pattern 30a) is in the form of an elongated strip which defines, in effect, the bus bar conductor with integral fingers or prongs 34 and 34a extending transversely from the main bodies of respective conductor patterns 30 and 30a to define projections or fingers for interconnection of the bus bar to electronic equipment.

The conductive patterns 30 and 30a are electrically connected to the opposed conductive surfaces 13, 13a on the ceramic wafers 11 to provide the appropriate electrical interconnection between the bus bar components and the capacitive elements for filtering. This electrical interconnection may be accomplished by conductive adhesive or any other suitable method. Similarly, the printed circuit bus bar elements 28, 30 and 28a, 30a may also be mechanically connected, as by adhesive or otherwise, to central spacer 20 to mechanically complete the assembly of the unit.

Since all of the components of the embodiment of FIGS. 3-5, other than the capacitive elements 14, may be formed as flexible printed circuits, an assembly of this type will find principal application in operating environments where it will be laid flat on another supporting structure. However, if it is desired to make an assembly of this type free-standing, central spacer 20 may be a rigid insulating material, or some other stiffening elements may be added to the assembly.

The bus bar conductors of the present invention are copper elements, which may be tin plated; and they are approximately 10 mils thick and range in width or height from about 0.150 to about 0.200 inch and range in length from about 2 to 16 inches, depending on the particular application for the bus bar. The ceramic material from which the capacitive elements or strip capacitors are formed preferably has a relatively high dielectric constant, a dielectric constant in excess of 8,000 for example, and the thickness of the dielectric material may range from about 0.005 inch to about 0.015 inch. The capacitive elements will typically have opposed face surface dimensions, measured parallel to the planes defined by the bus conductors, in the range of from about 0.2 inch by 0.2 inch to about 0.2 inch by 3.0 inches for individual capacitive elements.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A bus bar assembly including:
   centrally disposed electrically insulating spacer means having at least one opening therein;
   capacitor means in said opening in said spacer means, said capacitor means including a layer of dielectric material having a pair of opposed first and second planar surfaces with first and second respective electrically conductive layers on each of said planar surfaces;
   first and second bus bar means positioned on opposite sides of said capacitor means;
   first and second means for connecting said first and second bus bar means respectively to the conductive layers on each of said first and second planar surfaces of said capacitor means; and
   said first and second connecting means being comprised of an assembly of a conductor on a flexible substrate, with the conductor thereof in electrical contact with said first and second conductive layers, respectively, of said capacitor means, and said assemblies retaining said capacitor means in the bus bar assembly.

2. A bus bar assembly as in claim 1 including:
   a plurality of openings in said spacer means;
   at least one of said capacitor means in each of said openings; and the conductors of said assemblies being in electrical contact with corresponding opposed first and second conductive layers of each of said capacitor means.

3. A high capacitance bus bar assembly including:

centrally disposed electrically insulating spacer means having at least one opening therein;

first and second bus bar conductors on opposed sides of said spacer means, at least one of said bus bar conductors having at least one opening therein in registration with said opening in said spacer means;

capacitor means in said openings in said spacer means, said capacitor means having a layer of dielectric material with a pair of opposed first and second planar surfaces with electrically conductive layers on each of said planar surfaces;

first and second connecting means for connecting said first and second bus bar conductors respectively to the conductive layers on each of said first and second planar surfaces of said capacitor means; and said connecting means between said one bus bar conductor and the conductive layer on said capacitor means comprising:

an assembly of a printed circuit conductor on a flexible substrate with said printed circuit conductor bridging the opening in said one bus bar and being in electrical contact with said conductive layer on said capacitor means and with said one bus bar.

4. A high capacitance bus bar assembly as in claim 3 wherein:

said spacer means has a plurality of openings therein;

each of said bus bar conductors has a plurality of openings therein in registration with said openings in said spacer means;

said capacitor means are positioned in each of said registered openings; and each of said first and second connecting means comprises an assembly of printed circuit conductor on a flexible substrate, with the printed circuit conductor of said first connecting means bridging the openings in said first bus bar conductor and being in electrical contact with said first bus bar conductor and the conductive layers on the first surface of each of said capacitor means, and the printed circuit conductor of said second connecting means bridging the openings in said second bus bar conductor and being in electrical contact with said second bus bar conductor and the conductive layer on the second surface of each of said capacitor means.

5. A high capacitance bus bar assembly as in claim 4 wherein:

said connecting means are bonded to said bus bar conductors and to said capacitor means to retain said capacitor means in the bus bar assembly.

6. A high capacitance bus bar assembly including:

centrally disposed electrically insulating spacer means having first and second opposed planar surfaces and at lease one opening therein;

capacitor means in said opening in said spacer means, said capacitor means having a layer of dielectric material with first and second opposed planar surfaces with electrically conductive layers thereon;

first and second bus bar means, said first bus bar means being on said first surface of said spacer means and said second bus bar means being on said second surface of said spacer means; and each of said bus bar means being comprised of an assembly of a flexible nonconductive substrate and a conductor on the substrate, the conductor of said first bus bar means bridging said opening in said spacer means on said first surface of said spacer means and being in electrical contact with the electrically conductive layer on said first planar surface of said capacitor means, and the conductor of said second bus bar means bridging said opening in said spacer means on said second surface of said spacer means and being in electrical contact with the electrically conductive layer of said second planar surface of said capacitor means.

7. A high capacitance bus bar assembly as in claim 6 wherein:

said spacer means has a plurality of openings therein with capacitor means in each of said openings; and said conductors of said first and second bus bar means bridging each of said plurality of openings and being in contact, respectively, with the conductive layers on the first and second planar surfaces of the capacitor means in each of said openings.

8. A high capacitance bus bar assembly as in claim 7 wherein:

said conductor of each of said first and second bus bar means includes projecting interconnection conductors.

9. A high capacitance bus bar assembly as in claim 8 wherein:

each of said first and second bus bar means is a flexible printed circuit.

* * * * *